United States Patent
Schmoll et al.

(10) Patent No.: US 8,947,672 B2
(45) Date of Patent: Feb. 3, 2015

(54) SYSTEMS AND METHODS FOR ARTIFACT SUPPRESSION BY FREQUENCY SHIFTING OR CAVITY LENGTH ADJUSTMENT

(71) Applicant: Carl Zeiss Meditec, Inc., Dublin, CA (US)

(72) Inventors: Tilman Schmoll, Dublin, CA (US); Matthew J. Everett, Livermore, CA (US); Utkarsh Sharma, San Leandro, CA (US); Alexandre R. Tumlinson, San Leandro, CA (US); Michael Kempe, Dublin, CA (US)

(73) Assignee: Carl Zeiss Meditec, Inc., Dublin, CA (US)

( * ) Notice: Subject to any disclaimer, the term of this patent is extended or adjusted under 35 U.S.C. 154(b) by 147 days.

(21) Appl. No.: 13/782,311

(22) Filed: Mar. 1, 2013

(65) Prior Publication Data

US 2014/0029015 A1    Jan. 30, 2014

Related U.S. Application Data

(60) Provisional application No. 61/676,250, filed on Jul. 26, 2012.

(51) Int. Cl.
*G01B 11/02* (2006.01)
*H01S 3/13* (2006.01)
(Continued)

(52) U.S. Cl.
CPC ........ *G01B 9/02058* (2013.01); *H01S 3/10053* (2013.01); *G01B 9/02004* (2013.01); *G01B 9/02091* (2013.01); *H01S 3/105* (2013.01);
(Continued)

(58) Field of Classification Search
USPC ........... 356/497, 479; 372/20, 29.022, 29.023
See application file for complete search history.

(56) References Cited

U.S. PATENT DOCUMENTS

| 7,430,227 B2 | 9/2008 | Schubert et al. |
| 7,835,009 B2 | 11/2010 | Minneman et al. |

(Continued)

FOREIGN PATENT DOCUMENTS

| WO | 2011/000153 A1 | 1/2011 |
| WO | 2012/107307 A1 | 8/2012 |

OTHER PUBLICATIONS

Baek et al., "High-Resolution Mode-Spacing Measurement of the Blue-Violet Diode Laser Using Interference of Felds Created with Time Delays Greater Than the Coherence Time", Japanese Journal of Applied Physics, vol. 46, No. 12, 2007, pp. 7720-7723.

(Continued)

*Primary Examiner* — Kara E Geisel
*Assistant Examiner* — Violeta A Prieto
(74) *Attorney, Agent, or Firm* — Morrison & Foerster LLP

(57) ABSTRACT

Swept source designs that eliminate or significantly reduce artifacts in optical coherence tomography are presented. One embodiment of the present invention is a source design that frequency shifts the coherence revival interference signal to a frequency larger than the A/D detection bandwidth or the post-processing bandwidth. In another embodiment, the introduced frequency shift is large enough to introduce a Doppler shift of the modes of the laser, which causes a blurring of the comb function, and thus eliminates or reduces mode hopping. In another embodiment, adjusting the cavity optical path length prior to data acquisition depending on the given optical layout configuration to reduce or eliminate coherence revival artifacts is described.

24 Claims, 4 Drawing Sheets

(51) Int. Cl.
*G01B 9/02* (2006.01)
*H01S 3/10* (2006.01)
*H01S 3/105* (2006.01)
*H01S 3/106* (2006.01)
*H01S 5/14* (2006.01)

(52) U.S. Cl.
CPC ............... *H01S 3/1068* (2013.01); *H01S 5/141* (2013.01); *H01S 5/146* (2013.01); *H01S 3/106* (2013.01)
USPC .................. 356/497; 372/29.022; 372/29.023

(56) References Cited

U.S. PATENT DOCUMENTS

| | | |
|---|---|---|
| 2002/0191651 A1 | 12/2002 | Funakawa |
| 2003/0026302 A1 | 2/2003 | Anthon et al. |
| 2006/0215724 A1 | 9/2006 | Sesko |
| 2012/0162662 A1 | 6/2012 | Johnson et al. |
| 2012/0188555 A1* | 7/2012 | Izatt et al. ................ 356/479 |

OTHER PUBLICATIONS

Barfuss et al., "Modified Optical Frequency Domain Reflectometry with High Spatial Resolution for Components of Integrated Optics Systems", Journal of Lightwave Technology, vol. 7, No. 1, Jan. 1989, pp. 3-10.

Chong et al., "Spectral Narrowing Effect by Quasi-Phase Continuous Tuning in High-Speed Wavelength-Swept Light Source", Optics Express, vol. 16, No. 25, Dec. 8, 2008, pp. 21105-21118.

Davis et al., "Heterodyne Swept-Source Optical Coherence Tomography for Complete Complex Conjugate Ambiguity Removal", Journal of Biomedical Optics, vol. 10, No. 6, Nov./Dec. 2005, pp. 064005-1-6.

Dhalla et al., "Complex Conjugate Resolved Heterodyne Swept Source Optical Coherence Tomography Using Coherence Revival", Biomedical Optics Express, vol. 3, No. 3, Mar. 1, 2012, pp. 663-649.

Leitgeb et al., "Complex Ambiguity-Free Fourier Domain Optical Coherence Tomography through Transverse Scanning", Optics Letters, vol. 32, No. 23, Dec. 1, 2007, pp. 3453-3455.

Leitgeb et al., "Ultrahigh Resolution Fourier Domain Optical Coherence Tomography", Optics Express, vol. 12, No. 10, May 17, 2004, pp. 2156-2165.

Wang, Ruikang K., "In Vivo Full Range Complex Fourier Domain Optical Coherence Tomography", Applied Physics Letters, vol. 90, 2007, pp. 054103-1-3.

Yun et al., "Removing the Depth-Degeneracy in Optical Frequency Domain Imaging With Frequency Shifting", Optics Express, vol. 12, No. 20, Oct. 4, 2004, pp. 4822-4828.

Zhang et al., "Removal of a Mirror Image and Enhancement of the Signal-to-Noise Ratio in Fourier-Domain Optical Coherence Tomography Using an Electro-Optic Phase Modulator", Optics Letters, vol. 30, No. 2, Jan. 15, 2005, pp. 147-149.

* cited by examiner

SYSTEMS AND METHODS FOR ARTIFACT SUPPRESSION BY FREQUENCY SHIFTING OR CAVITY LENGTH ADJUSTMENT

PRIORITY

The following application claims priority to U.S. Provisional Application Ser. No. 61/676,250 filed Jul. 26, 2012 hereby incorporated by reference in its entirety.

TECHNICAL FIELD

The present invention is related to the field of optical imaging, and in particular to artifact removal and reduction in optical coherence tomography (OCT) imaging.

BACKGROUND

Optical coherence tomography (OCT) is a noninvasive, noncontact imaging modality that uses coherence gating to obtain high-resolution cross-sectional images of tissue microstructure. In Fourier domain OCT (FD-OCT), the interferometric signal between light from a reference and the back-scattered light from a sample point is recorded in the frequency domain rather than the time domain. After a wavelength calibration, a one-dimensional Fourier transform is taken to obtain an A-line spatial distribution of the object scattering potential. The spectral information discrimination in FD-OCT is accomplished typically by using a dispersive spectrometer in the detection arm in the case of spectral-domain OCT (SD-OCT) or rapidly tuning a swept laser source in the case of swept-source OCT (SS-OCT). Variants of FD-OCT such as Parallel OCT, Full-Field OCT, and Holoscopy have been proposed to overcome limitations and increase the imaging depth.

Many swept sources include a wavelength selectable optical filter, where the optical filter transmission wavelength or frequency is adjusted to cause the laser to sweep in wavelength or frequency. In such designs, the laser cavity length is fixed, limiting the operating wavelengths or frequencies of the swept source to the discrete longitudinal modes of the laser. Thus, as the filter is swept in transmission frequency, the laser will hop from one mode to the next in a discrete manner. The result is that the swept source laser generates a spectral comb function, rather than a smooth distribution of frequencies. As the Fourier transform of a comb function is a comb function, the coherence function of the swept source laser is therefore a comb function. In OCT systems, this leads to an effect known as interference revival or coherence revival (see for example Baek et al., "High-resolution mode-spacing measurement of the blue-violet diode laser using interference of fields created with time delays greater than the coherence time," Jpn. J. Appl. Phys. 46, 7720-7723, 2007 and Dhalla et al., "Complex conjugate resolved heterodyne swept source optical coherence tomography using coherence revival," Biomed. Opt. Express 3, 663-649, 2012 hereby incorporated by reference). In OCT systems that do not have coherence revival effect, the interference fringes can only be observed when the optical path lengths of the sample and reference arms are matched (i.e. standard mode zero optical delay position). However, in systems with coherence revival effects, interference fringes can also be observed when the optical path lengths of the sample and reference arms are mismatched by close to an integer multiple of the laser cavity length.

Typical OCT systems have several optical surfaces in the sample arm and it may not be possible to totally eliminate the back-reflections from theses surfaces. Coherence revival poses a serious challenge for optical system design as even small back-reflections from any optical surface in the sample arm that may occur close to an integer multiple of laser cavity lengths away from the intended sample location would result in unwanted interference signal. The resulting interference signals will lead to artifacts superimposed on the actual tomogram. Those artifacts can be quite prominent and may lead to misinterpretation of images or erroneous analysis results. In this document, the terms coherence revival mode, coherence revival artifact, coherence revival signal, coherence revival interference are used interchangeably to refer to interference signal that is achieved when the optical path lengths of the reference arm and the back-scattered signal location are mismatched by close to an integer multiple of laser cavity lengths away from the standard mode zero optical delay position. In this document, we may use the term "pseudo path-matched" in the context of coherence revival interference when the optical path delay between sample (or the location of back-scattered signal) and reference arms are mismatched by an integer multiple of cavity lengths.

So far there is to the best of our knowledge no known method for reduction or removal of coherence revival artifacts. One may try to avoid the artifacts by designing the optics of the OCT interferometer such that the location of all optical surfaces or unwanted back-scattering locations do not overlap with the positions of the optical path where coherence revival occurs (i.e. close to an integer multiple of laser cavity length away from the standard zero delay position). In complex optical systems this may however not always be possible.

Dhalla et al. showed that some commercially available external cavity tunable lasers (ECTLs) exhibit a relative spectral frequency shift between light of the sample arm and light of the reference arm, when interference happens in the coherence revival mode (i.e. reference arm and sample arm are offset by an integer multiple of the laser cavity length) (see for example Dhalla et al., "Complex conjugate resolved heterodyne swept source optical coherence tomography using coherence revival," Biomed. Opt. Express 3, 663-649, 2012 hereby incorporated by reference). The phase modulation results in a frequency shifted interferogram in the coherence revival mode. In normal mode (i.e. if the optical path lengths of reference arm and sample arm are closely matched), the phase modulation is not detectable by OCT, since the phase modulation effect is identical in the reference and sample beams. It is believed that the phase modulation in these ECTLs is caused by the SOA inside the laser cavity.

Dhalla et al. showed that, similar to the heterodyne detection in SS-OCT by use of electro optic or acousto optic modulators in one of the arms (see for example Yun et al., "Removing the depth-degeneracy in optical frequency domain imaging with frequency shifting," Opt. Express 12, 4822-4828, 2004), the frequency shifted interferogram in coherence revival mode may be used for complex conjugate resolved heterodyne SS-OCT. In this method, a carrier frequency is effectively introduced to the original spectral fringe signal to resolve the complex conjugate signal. Yun et al. introduced the relative frequency shift between reference and sample beam using acousto optic modulators in reference and sample arm. Dhalla et al. didn't require additional frequency shifters, because the SOA inside the cavity created a similar relative frequency shift in coherence revival mode. In standard OCT systems, typically zero frequency fringes in the interference spectra correspond to zero optical path delay. However in complex conjugate resolved heterodyne SS-OCT, the true zero optical path delay results in spectral fringes at the carrier frequency. Hence, the formerly positive and negative frequencies are all shifted towards one side of zero frequency while the best fringe visibility is maintained at the depth corresponding to matched group delay. The shift caused by the carrier frequency allows for distinction between positive and negative frequencies and also helps in making use of the full coherence length. However, as one still performs the Fourier transform of a real valued signal, the signal after the Fourier transform remains Hermitian.

In addition to the work by Yun et al, Zhang et al. published results using an electro-optic phase modulator (EOM) in the reference arm to create a similar frequency shift of the fringe signal (Zhang et al., "Removal of a minor image and enhancement of the signal-to-noise ratio in Fourier-domain optical coherence tomography using an electro-optic phase modulator," Opt. Lett. 30, 147-149, 2005). Davis et al. reported a system using acousto optic frequency shifters in the reference arm and sample arm (Davis et al., "Heterodyne swept-source optical coherence tomography for complete complex conjugate ambiguity removal," J. Biomed. Opt.10, 064005, 2005). None of these groups explored the possibility of reducing coherence revival artifacts, but rather focused on use of the coherence revival mode for complex conjugate resolved SS-OCT instead of the standard coherence mode for imaging. Dhalla et al. makes the suggestion that the laser may be designed to produce an optimized coherence revival mode for complex conjugate resolved heterodyne SS-OCT, but makes no suggestions regarding how to minimize the coherence revival mode signal or how these designs may be achieved.

SUMMARY

In light of the issues described above, it is an object of the present invention to greatly reduce or eliminate coherence revival signal or artifacts in SS-OCT imaging. The systems and methods described herein could apply to any type of inteferometric imaging with swept-laser sources including but not limited to SS-OCT, Full-Field OCT, Parallel OCT, and Holoscopy. The embodiments of the present invention are directed towards optimized design of the swept-source itself and require no changes to the interferometer or additional post-processing steps. One embodiment of the present invention is a source design that frequency shifts the coherence revival interference signal to a frequency larger than the A/D detection bandwidth or the post-processing bandwidth. In another embodiment, the introduced frequency shift is large enough to introduce a Doppler shift of the modes of the laser, which causes a blurring of the comb function, and thus eliminates or reduces mode hopping. In another embodiment, adjusting the cavity optical path length depending on the given optical layout configuration is described (such as changing the optical configuration to compensate for refractive error or switching from posterior to anterior mode).

BRIEF DESCRIPTION OF THE DRAWINGS

FIG. 3a shows the fall-off plot for the normal interference mode. The solid line indicates signals within the detection bandwidth; dashed line indicates signals outside the detection bandwidth. FIG. 3b shows the fall-off plot for a coherence revival interference mode, where the relative intra cavity frequency shift, $\Delta v$, between sample and reference light is set to cause the strongest signal within the detection bandwidth to be shifted outside of the detection bandwidth.

DETAILED DESCRIPTION

Figure 1:
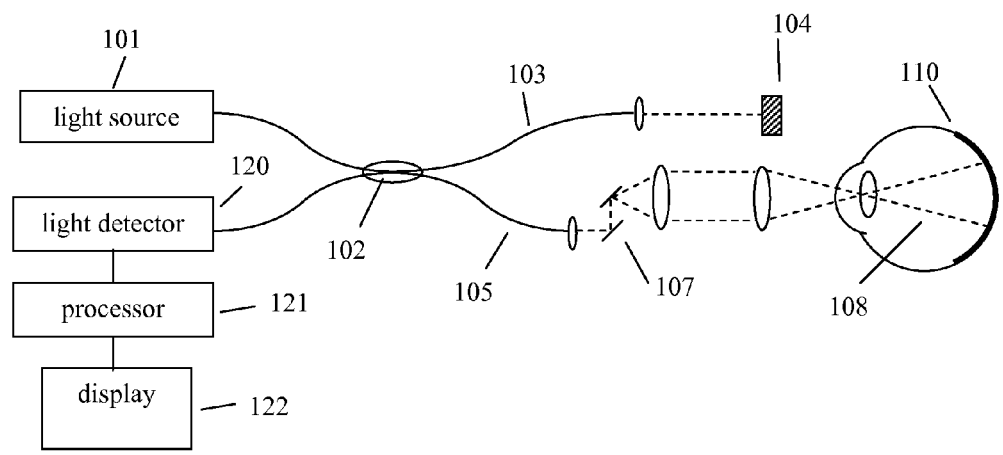
FIG. 1 shows a generalized OCT system for ophthalmic imaging.

A diagram of a generalized FD-OCT system for use in ophthalmology is shown in FIG. 1. Light from source 101 is routed, typically by optical fiber 105, to illuminate the sample 110, a typical sample being tissues in the human eye. The source 101 can be either a broadband light source with short temporal coherence length in the case of SD-OCT or a wavelength tunable laser source in the case of SS-OCT. The light is scanned, typically with a scanner 107 between the output of the fiber and the sample, so that the beam of light (dashed line 108) is scanned laterally (in x and y) over the area or volume to be imaged. Light scattered from the sample is collected, typically into the same fiber 105 used to route the light for sample illumination. Reference light derived from the same source 101 travels a separate path, in this case involving fiber 103 and retro-reflector 104 with an adjustable optical delay. Those skilled in the art recognize that a transmissive reference path can also be used and that the adjustable delay could be placed in the sample or reference arm of the interferometer. Collected sample light is combined with reference light, typically in a fiber coupler 102, to form light interference in a detector 120. Although a single fiber port is shown going to the detector, those skilled in the art recognize that various designs of interferometers can be used for balanced or unbalanced detection of the interference signal. The output from the detector is supplied to a processor 121. The results can be stored and/or analyzed in the processor 121 or displayed on display 122.

The interference causes the intensity of the interfered light to vary across the spectrum. The Fourier transform of the interference light reveals the profile of scattering intensities at different path lengths, and therefore scattering as a function of depth (z-direction) in the sample (see for example Leitgeb et al. "Ultrahigh resolution Fourier domain optical coherence tomography," Optics Express 12(10):2156 2004 hereby incorporated by reference). The profile of scattering as a function of depth is called an axial scan (A-scan). A set of A-scans measured at neighboring locations in the sample produces a cross-sectional image (tomogram or B-scan) of the sample. A collection of B-scans makes up a data cube or cube scan.

Figure 2:
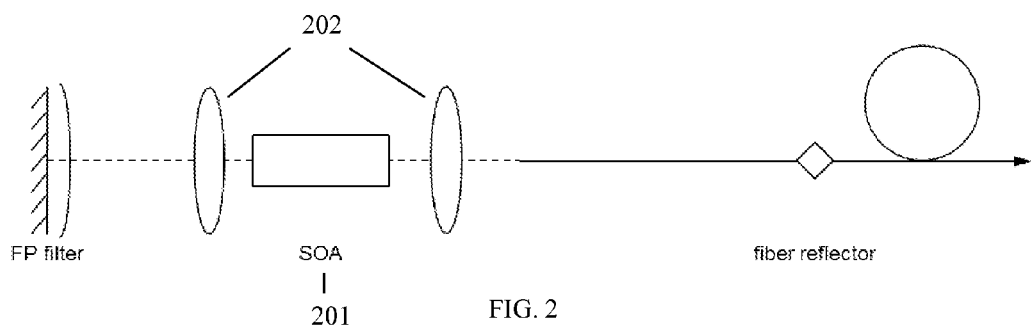
FIG. 2 is a schematic of a typical external cavity tunable laser based on a semiconductor optical amplifier (SOA).

The invention described herein is focused on design considerations of the laser source 101 such that coherence revival artifacts are significantly reduced or eliminated when the source is used in an OCT system, such as the system shown in FIG. 1. The techniques could be applied to any type of OCT or interferometric based imaging using swept-sources. Although the figures shows the sample being a human eye, applications of this invention are not limited to eye and can be applied to any application using OCT. FIG. 2 shows a generalized external cavity tunable laser (ECTL) based on a semiconductor optical amplifier (SOA) 201. The dashed portions of the cavity are free space components while the solid line indicates fiber components. Two lenses 202 surround the SOA. A Fabry-Perot filter (FP filter) is located at one end of the cavity and is tuned to adjust the wavelength of the laser that exits the output end of the cavity at the fiber reflector. Additional tuning elements are known by those skilled in the art.

Figure 3:
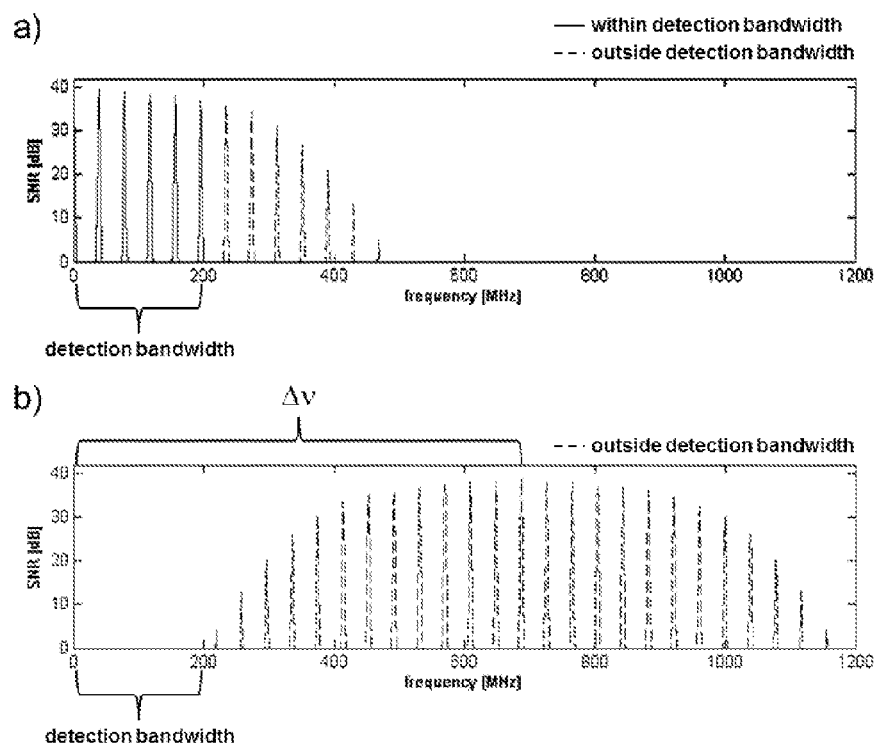
FIG. 3 illustrates the principle of shifting the coherence revival signal outside the analog detection bandwidth.
Figure 4:
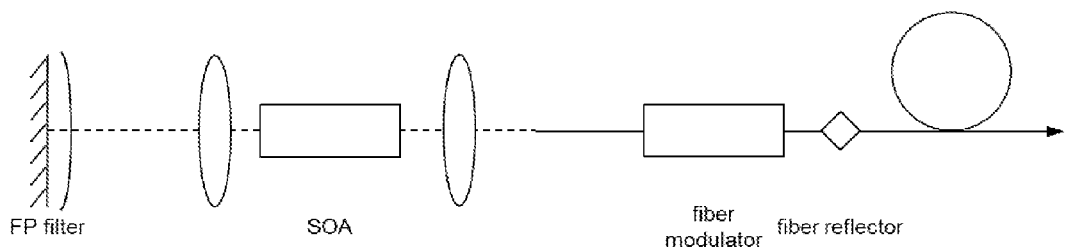
FIG. 4 illustrates an embodiment of the present invention in which a fiber modulator, for example a fiber EOM, fiber AOM, or fiber stretcher, is used to modulate the light insight the laser cavity.

In a first embodiment of the present invention, we propose to use a phase modulation created in the laser cavity, for removing or attenuating the coherence revival artifacts by shifting their pseudo path-matched fringe frequency outside the A/D detection bandwidth. We use the term, "pseudo path-matched" in the context of coherence revival interference when the optical path delay between sample (the location of backscattered signal) and reference arms is mismatched by an integer multiple of the cavity length of the laser. As a result of the phase modulation, the interferometric data in a pseudo path-matched condition experiences a frequency shift of $\Delta v = N * \omega_0$, where $\omega_0$ is proportinal to the phase modulation rate $(d\phi/dt)$, and N is the integer number of roundtrip cavity length mismatch. $\Delta v$ should be chosen large enough in order to shift the coherence revival fringe frequencies outside the A/D detection bandwidth. FIG. 3 illustrates the principle of shifting the coherence revival signal outside the analog detection bandwidth. FIG. 3*a* shows the fall-off plot for the normal interference mode. Solid line indicates signals within the detection bandwidth; dashed line indicates signals outside the detection bandwidth. FIG. 3*b* shows the fall-off plot for a coherence revival interference mode, where the relative intra cavity frequency shift $\Delta v$ between sample and reference light is set to cause the strongest signal within the detection bandwidth to shift outside the detection bandwidth. A fiber modulator such as an electro-optic modulator (EOM) located within the cavity of an ECTL can be used to introduce phase modulations capable of achieving this condition as illustrated in FIG. 4.

Figure 5:
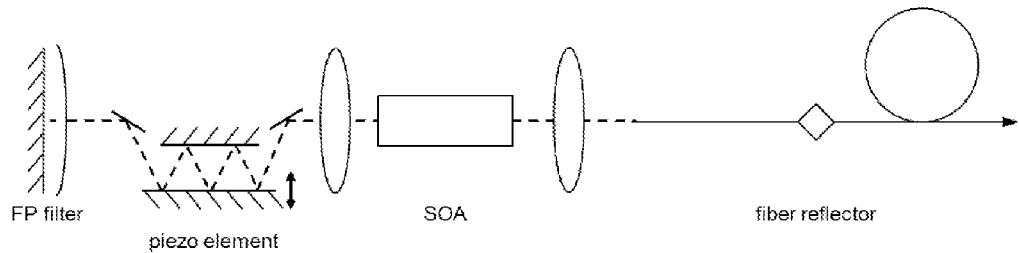
FIG. 5 illustrates an embodiment of the present invention in which a piezo element is implemented inside the laser cavity in order to vary the cavity length over time.

In a second and related embodiment of the invention, the phase modulation can be realized by continuous optical path length variation of the cavity during the wavelength sweeping action of the laser (e.g. using an acosto-optical modulator, FBG, piezo element, etc.). FIG. 5 illustrates an embodiment where a piezo element is placed inside the laser cavity. Since the wavelength varies with time during the sweep, an optical path length change in the cavity with respect to wavelength results in a phase modulation of the emitted light from the laser source. If the phase modulation is introduced as a function of time during the sweep, either sample light or reference light experiences a relative spectral frequency shift in a coherence revival configuration.

In another related embodiment one would make use of effects created by an optical wave traveling in a third order nonlinear medium, as for example cross phase modulation, cross gain modulation, wavelength conversion or four wave mixing. A suitable non-linear medium could be a semiconductor optical amplifier (SOA), which is known to create a self frequency shift of the amplified light. The SOA may be designed to meet the desired frequency shift. The SOA could be either the laser's gain medium as illustrated in FIG. 2 or could be an additional optical element placed into the laser cavity to create the desired effect.

In a frequency-shifted spectra, the signal from pseudo path matched lengths would experience an axial position shift, $\Delta z$, that can be defined by: $\Delta z = N * M * \lambda_0$, where M is the slope of the optical path length variation with respect to the wavelength inside the laser cavity, N is the number of roundtrip cavity lengths mismatch, and $\lambda_0$ is the central wavelength of the sweep. Phase modulation or optical pathlength variation can be used to achieve an axial position shift large enough such that the frequency shift $\Delta v$ associated with the coherence revival mode is higher than the A/D detection bandwidth or the bandwidth imposed by post processing. This requires that the frequency shift be in the range or larger than the maximum sampling frequency needed to achieve a given imaging depth of interest. The magnitude of this frequency shift can be determined experimentally or by numerical simulations depending on the amount of attenuation desired for the coherence revival signal. The factors that may affect the attenuation of the coherence revival artifact are the magnitude of the frequency shift, the coherence length of the laser and the A/D detection bandwidth.

Phase modulations or optical path length (OPL) variations may be introduced inside the laser cavity during the sweeping of the source by a variety of elements including but not limited to a piezo element, an electro optical modulator (EOM), an acousto optical modulator (AOM), a fiber stretcher, a modulated FBG (often used as one reflector of the laser cavity), or a dispersive optical delay line. FIG. 3 illustrates a convenient way to implement a fiber coupled modulator inside the laser cavity. In sources using a semiconductor optical amplifier as a gain medium (FIG. 5), the semiconductor optical amplifier's self frequency shift may be designed to meet the desired frequency shift. In this case no additional elements would have to be introduced to the laser cavity. The action of these elements would result in a frequency shifted interferogram for coherence revival mode. The frequency shift introduced by changing the OPL can be expressed as: $\Delta v/v_0 = \Delta OPL/(c * \Delta t)$. For example, a rate of change in the cavity of 6 µm/nm (5 µs sweep period over 100 nm) would result in N*120 MHz of frequency shift, where N is the number of roundtrip cavity length mismatch. Hence it would be equivalent to shifting the zero-path length fringe frequency by an amount ~N*120 MHz. In an EOM, the modulation is given by the index of refraction change $\Delta n(t)$ as $\Delta n * v$. With typical values $\Delta n \approx 10^{-6}$ we obtain a modulation in the range N*100 MHz. Since for an AOM the modulation is given by the frequency of the acoustic wave, it is in the very same range. In all these active modulators, a carrier frequency to the original spectral signal is introduced in coherence revival mode, thereby all the formerly positive and negative frequencies are shifted towards one side of zero frequency while the best fringe visibility is maintained at the depth corresponding to matched group delay. The shifted signal still experiences a fall-off due to the finite coherence length of the source. In normal interference mode (N=0) the interferogram remains unaffected by the intra-cavity modulation, as sample light and reference light are affected to the same extent.

The inherent phase modulation of at least the currently commercially available Axsun External Cavity Tunable Laser (ECTL) (Axsun Technologies, Inc. Billerica, Mass.) is non-linear in wavelength, which results in a chirped modulation frequency. This non-linearity introduces a material dispersion like effect, resulting in axial point spread function (PSF) broadening of the coherence revival mode signal. As described herein, the proposed active phase or frequency shifting elements can be easily driven with an arbitrary function, and the additionally introduced phase or frequency shifting function may be designed in manner that it would compensate for this non-linearity. Another way to compensate for this non-linearity is to specifically adjust the dispersion inside the cavity in order to optimize the axial PSF of the coherence revival signal. A narrow axial PSF of the coherence revival signal is desireable because broadly dispersed coherence revial peaks may reach further into the imaging bandwidth and cause an effect similar to a raised noise floor. To compensate for this effect the additionally introduced phase modulation would have to be unnecessarily higher compared to a case where the axial PSF of the coherence revival mode is narrow.

The choice of cavity length of currently available ECTLs for swept source OCT are somewhat constrained by the optical design of the system or the sample characteristics due to the possibility of coherence revival artifacts. For example, in an ophthalmic system, if the cavity length is approximately the same as the length of the eye, back-scattered light from the anterior segment may appear as coherence revival artifacts when attempting to image the posterior segment. The cavity length is also a limiting factor in coherence length and tuning speed. A shorter cavity can typically tune faster while maintaining higher coherence length than a longer cavity, because the cavity filter, which narrows the instantaneous linewidth, can be traversed multiple times in a shorter time period. The above invention of suppressing the coherence revival artifact, may allow for shorter cavity lengths and thereby allow for greater laser tuning speed. The proposed concepts can apply to both small integrated swept sources such as the commercially available ECTL, or full laser systems such as a titanium-sapphire swept source. There are multiple ways to adjust the cavity length of the laser as would be appreciated by someone skilled in the art.

In a further embodiment of the invention, the optical path length variation or phase modulation is arranged such that the laser modes are continuously swept instead of mode hopping to discrete frequencies thereby blurring out the comb function and reducing the coherence revival effects. Such cavity optical path length variations or phase modulations can result in Doppler shifting the modes of the laser at the same rate as the filter is sweeping the wavelengths, thus eliminating or reducing mode-hopping. Eliminating or reducing the mode hopping also allows the laser to be swept at much higher rates as the cavity modes are maintained and do not have to build back up again from spontaneous emission. Another key recognition here is that if the wavelength of the laser is swept, then the effective coherence length of the measurement is given by the width of the spectrum swept during the acquisition time, rather than the instantaneous spectrum of the laser.

A preferred embodiment for eliminating or reducing mode hopping would be to use a piezo element to vary the cavity optical path length during the sweeping of the source. This would cause the Doppler shifted radiations to follow the wavelength shift generated by the filter for short intervals, jumping the cavity back to roughly its original length at the end of each interval, so as to track the modes while varying the cavity length only a small amount. If one is acquiring the OCT signal over a fixed interval, for instance the integration time of the camera in OCT holoscopy, then this interval can be set to match the camera acquisition time so that each acquisition covers a smooth spectrum rather than discrete frequencies defined by a static cavity length.

Adjusting the Doppler-shifted radiations caused by laser cavity length variations and filter transmission wavelength together so that they remain matched can be challenging. One can take advantage of the fact that the cavity will dump energy if there is a mismatch between the laser modes and filter transmission by monitoring the energy output as the cavity length and filter are adjusted. In the case of a mismatch, the output will spike upward as the cavity dumps, and then decrease. If one puts a fast modulation on either the filter wavelength or the cavity length, the laser power will be modulated, and be at a minimum when the filter and cavity length are properly matched. Thus, the location of this power minimum, or the phase of the oscillation can be used to monitor how well the cavity length and filter are matched and fine tune this matching during the spectral sweep. This modulation of the laser may create some noise in the OCT signal. This noise can be minimized by having an integral number of oscillations during each signal acquisition.

In another embodiment of the present invention, the cavity optical path length can be adjusted depending on the given optical layout configuration (such as changing the optical configuration to compensate for refractive error or switching from posterior to anterior imaging modes). It should be noted that this embodiment is different from the previous embodiments that consist of cavity path length variations during the sweep to cause frequency shifts. In this embodiment, the cavity path length is changed by a given offset to move the coherence revival signal out of the imaging window before the image acquisition. This is a one-time adjustment of the cavity length prior to the acquisition scan. This method can also be applied in conjunction with frequency shifting for suppression of coherence revival artifacts as described above.

In a majority of OCT systems, the primary source of coherence revival artifact may arise from the optical surfaces nearer to the tissue imaging plane. The amplitude and sharpness of the coherence revival signal as characterized by the PSF will fade away as you move away from the zero optical path length delay for typical ECTLs used in SSOCT systems. Adjusting the laser cavity length (OPL) will result in relative displacement of the main imaging mode and the coherence revival imaging mode and hence small changes in cavity lengths can be used to push out the coherence artifacts from the desired imaging depth range. Cavity length can be adjusted by ±10% with minimal effects on laser properties. Changing the length may have some small impact on coherence length of the laser as the round-trip time is affected.

Figure 6:
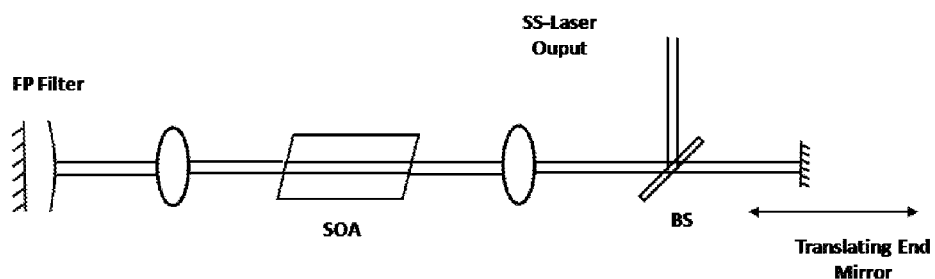
FIG. 6 illustrates an embodiment of the present invention in which a translating end mirror is used to adjust the cavity length of the swept source laser to reduce or eliminate coherence revival artifacts.
Figure 7:
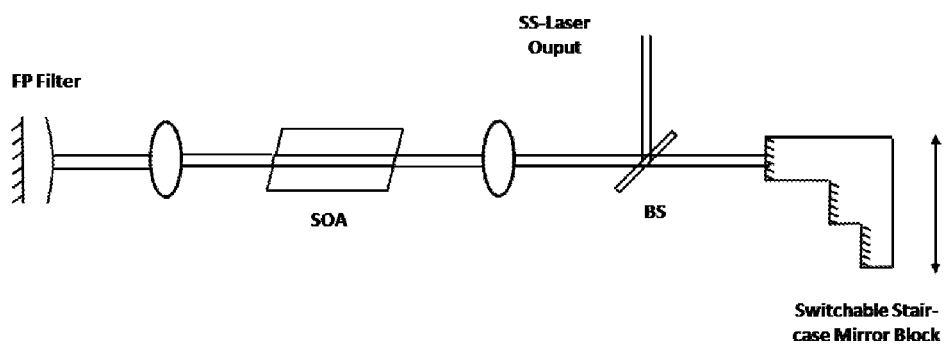
FIG. 7 illustrates an embodiment of the present invention in which a stair-case minor component is used as one of the reflector ends, whereas this component can be shifted to obtain a cavity with adjustable discrete path lengths.
Figure 8:
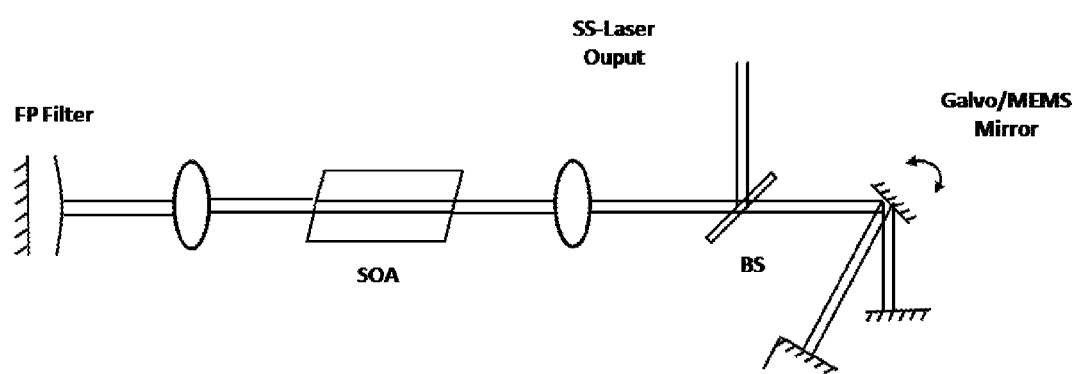
FIG. 8 illustrates an embodiment of the present invention in which a galvanometer based mirror or MEMS scanner is used to steer the laser beam inside the cavity to switch between cavity configurations to adjust path lengths.

There are a variety of methods that can be used to adjust the cavity length (in continuous or discrete steps) including but not limited to:
1. Using a translational delay to shift the position of either the high end reflector or the output coupler (FIG. 6).
2. Using a stair-case mirror component at one of the reflector ends, whereas this component can be shifted to obtain cavity with adjustable discrete path lengths (FIG. 7).
3. Using a galvanometer based mirror or MEMS scanner to steer the laser beam inside cavity to switch between cavity configurations to adjust path lengths (FIG. 8).
4. Flipping in a glass rod to change the optical path length inside the cavity.
5. Tuning a FBG to switch between reflection and transmission. With a cascade of tunable FBGs several cavity lengths can be realized and a fast switching can be achieved.

Although various applications and embodiments that incorporate the teachings of the present invention have been shown and described in detail herein, those skilled in the art can readily devise other varied embodiments that still incorporate these teachings.

The following references are hereby incorporated by reference:

Baek et al., "High-resolution mode-spacing measurement of the blue-violet diode laser using interference of fields created with time delays greater than the coherence time," Jpn. J. Appl. Phys. 46, 7720-7723, 2007.

Barfuss et al., "Modified optical frequency domain reflectometry with high spatial resolution for components of integrated optics systems," J. Lightwave Technol. 7, 3-10, 1989.

Chong et al., "Spectral narrowing effect by quasi-phase continuous tuning in high-speed wavelength-swept light source" Optics Express 16(25) 21105-21118, 2008.

Davis et al., "Heterodyne swept-source optical coherence tomography for complete complex conjugate ambiguity removal," J. Biomed. Opt.10, 064005, 2005.

Dhalla et al., "Complex conjugate resolved heterodyne swept source optical coherence tomography using coherence revival," Biomed. Opt. Express 3, 663-649, 2012.

Leitgeb et al. "Complex ambiguity-free Fourier domain optical coherence tomography through transverse scanning," Opt. Lett. 32, 3453-3455, 2007.

Leitgeb et al. "Ultrahigh resolution Fourier domain optical coherence tomography," *Optics Express* 12(10):2156 2004.

Yun et al., "Removing the depth-degeneracy in optical frequency domain imaging with frequency shifting," Opt. Express 12, 4822-4828, 2004.

Wang, "In vivo full range complex Fourier domain optical coherence tomography," Appl. Phys. Lett. 90, 054103, 2007.

Zhang et al., "Removal of a minor image and enhancement of the signal-to-noise ratio in Fourier-domain optical coherence tomography using an electro-optic phase modulator," Opt. Lett. 30, 147-149, 2005.

What is claimed is:

1. A laser source for use in an interferometric based imaging system, said laser comprising:
    a tunable filter for spectrally filtering light from a source to generate a tunable optical signal that is tuned over a wavelength band; and
    a phase modulating element to adjust the phase of the light as it is being tuned to reduce coherence revival signals in an interferometric image generated from the light.

2. A source as recited in claim 1, wherein the phase modulation element is an electro-optic modulator.

3. A source as recited in claim 1, wherein the phase modulation element is an acousto optic modulator.

4. A source as recited in claim 1, wherein the phase modulation element is a piezo element.

5. A source as recited in claim 1, wherein the phase modulation element is a dispersive grating optical delay line.

6. A source as recited in claim 1, wherein the phase modulation element is a semiconductor optical amplifier.

7. A source as recited in claim 1, wherein the phase modulation element is a fiber stretcher.

8. A source as recited in claim 1, wherein the magnitude of the phase modulation is selected such that the fringe frequency of the coherence revival signal is shifted outside the analog detection bandwidth.

9. A source as recited in claim 1, wherein the magnitude of the phase modulation is selected such that the fringe frequency of the coherence revival signal is shifted outside the bandwidth imposed by post-processing.

10. A source as recited in claim 1, wherein the magnitude of the phase modulation is selected such that the modes of the laser are Doppler shifted at the same rate as the filter is sweeping the wavelengths, thus eliminating or reducing mode-hopping in the source.

11. A laser source for use in an interferometric based imaging system, said laser comprising:
    a tunable filter for spectrally filtering light from a source to generate a tunable optical signal that is tuned over a wavelength band, wherein the source and the filter are located in a laser cavity having a laser cavity length; and
    a length adjusting element to adjust the laser cavity length to avoid coherence revival artifacts depending on the state of the optical system and the object investigated.

12. A source as recited in claim 11, wherein the length adjusting element continuously changes the physical length of the laser cavity.

13. A source as recited in claim 11, wherein the length adjusting element switches between different discrete cavity lengths.

14. A source as recited in claim 11, wherein the amount of cavity length adjustment is determined using a-priori information about the system.

15. A source as recited in claim 11, wherein the amount of cavity length adjustment is determined using a-priori information about the object being imaged.

16. A source as recited in claim 11, wherein the amount of cavity length adjustment is determined using information obtained while investigating the object being imaged.

17. A source as recited in claim 11, wherein the cavity length adjustment is achieved using a translating end minor.

18. A source as recited in claim 11, wherein the cavity length adjustment is achieved using a switchable staircase mirror block.

19. A source as recited in claim 11, wherein a galvanometer based mirror or MEMS scanner is used to steer the laser beam inside the cavity to switch between cavity configurations to adjust path lengths.

20. A source as recited in claim 11, further including a phase modulating element to adjust the phase of the light as it is being tuned to reduce coherence revival signals in an interferometric image generated from the light.

21. An optical coherence tomography (OCT) system for imaging a sample, said system comprising:
    a light source for generating a beam of radiation, wherein the source includes a tunable filter for spectrally filtering light to generate a tunable optical signal that is tuned over a wavelength band,
    a beam divider for separating the beam along a sample arm and a reference arm;
    optics for scanning the beam in the sample arm over a set of transverse locations on the sample and for combining light returning from the sample and reference arms;
    a detector for measuring the combined light, the detector generating output signals in response thereto; and
    a processor for generating an interferometric image from the output signals, wherein the light source includes a phase modulating element that adjusts the phase of the light as it is being tuned to reduce coherence revival signals in the interferometric image.

22. An OCT system as recited in claim 21, wherein the phase modulating element is selected from the group consisting of: an electro-optic modulator, an acousto-optic modulator, a piezo element, a dispersive grating optical delay line, a semiconductor optical amplifier, and a fiber stretcher.

23. An OCT system as recited in claim 21, wherein the magnitude of the phase modulation is selected such that the fringe frequency of the coherence revival signal is shifted outside the analog detection bandwidth.

24. An optical coherence tomography (OCT) system for imaging a sample, said system comprising:

a light source for generating a beam of radiation, wherein the source includes a tunable filter for spectrally filtering light to generate a tunable optical signal that is tuned over a wavelength band, wherein the filter is located in a laser cavity having a laser cavity length, a beam divider for separating the beam along a sample arm and a reference arm;

optics for scanning the beam in the sample arm over a set of transverse locations on a sample and for combining light returning from the sample and reference arms;

a detector for measuring the combined light, the detector generating output signals in response thereoto; and a processor for generating an interferometric image from the output signals, wherein the light source includes a length adjusting element to adjust the laser cavity length to avoid coherence revival artifacts in the interferometric image.

\* \* \* \* \*

UNITED STATES PATENT AND TRADEMARK OFFICE
CERTIFICATE OF CORRECTION

| | |
|---|---|
| PATENT NO. | : 8,947,672 B2 |
| APPLICATION NO. | : 13/782311 |
| DATED | : February 3, 2015 |
| INVENTOR(S) | : Tilman Schmoll et al. |

It is certified that error appears in the above-identified patent and that said Letters Patent is hereby corrected as shown below:

In the Specification

In column 5, line 28, delete "proportinal" and insert -- proportional --, therefor.

In column 5, line 49, delete "acosto-optical" and insert -- acousto-optical --, therefor.

In column 7, line 7, delete "desireable" and insert -- desirable --, therefor.

In column 7, line 8, delete "revial" and insert -- revival --, therefor.

In the Claims

In column 10, line 51, in claim 21, delete "thereoto;" and insert -- thereto; --, therefor.

In column 11, line 12, in claim 24, delete "thereoto;" and insert -- thereto; --, therefor.

Signed and Sealed this
Nineteenth Day of May, 2015

Michelle K. Lee
*Director of the United States Patent and Trademark Office*